(12) United States Patent
Tran et al.

(10) Patent No.: US 8,039,862 B2
(45) Date of Patent: Oct. 18, 2011

(54) WHITE LIGHT EMITTING DIODE PACKAGE HAVING ENHANCED WHITE LIGHTING EFFICIENCY AND METHOD OF MAKING THE SAME

(75) Inventors: Nguyen The Tran, Garden Grove, CA (US); Yungzhi He, Irvine, CA (US); Frank Shi, Irvine, CA (US)

(73) Assignee: Nepes LED Corporation, Chungcheongbuk-do (KR)

( * ) Notice: Subject to any disclaimer, the term of this patent is extended or adjusted under 35 U.S.C. 154(b) by 51 days.

(21) Appl. No.: 12/381,409

(22) Filed: Mar. 10, 2009

(65) Prior Publication Data
US 2010/0230693 A1 Sep. 16, 2010

(51) Int. Cl.
*H01L 33/00* (2010.01)
(52) U.S. Cl. ............. 257/99; 257/98; 257/100; 257/101
(58) Field of Classification Search ............ 257/98, 257/99, 100, 451, 799, 795, 787
See application file for complete search history.

(56) References Cited

U.S. PATENT DOCUMENTS

| 6,896,381 | B2 * | 5/2005 | Benitez et al. | 359/858 |
| 2006/0133044 | A1 * | 6/2006 | Kim et al. | 361/704 |
| 2008/0023721 | A1 * | 1/2008 | Lee et al. | 257/99 |
| 2008/0048201 | A1 * | 2/2008 | Kim et al. | 257/98 |
| 2010/0163918 | A1 * | 7/2010 | Kim et al. | 257/99 |

* cited by examiner

*Primary Examiner* — Wai Sing Louie
*Assistant Examiner* — Bilkis Jahan
(74) *Attorney, Agent, or Firm* — Ladas & Parry LLP

(57) ABSTRACT

A white light emitting diode (LED) package with multilayered encapsulation structure and the packaging methods are disclosed. The white LED package structure includes metal electrodes, a heat dissipation base, a PPA plastic for fixing the electrodes and the heat dissipation base together, at least one LED die, a die attaching material, gold wires for electrically connecting the LED die to the electrodes, a first type of silicone encapsulant, a second type of silicone encapsulant, and a phosphor containing layer. The invention utilizes a low-refractive index silicone (the second type of silicone encapsulant) to separate the phosphor containing layer away from the first type of silicone, which covers the LED die, to prevent/reduce emitted light going backward and hitting the LED die.

5 Claims, 1 Drawing Sheet

WHITE LIGHT EMITTING DIODE PACKAGE HAVING ENHANCED WHITE LIGHTING EFFICIENCY AND METHOD OF MAKING THE SAME

BACKGROUND OF INVENTION

1. Field of the Invention

This invention is related to a light emitting diode (LED) device; more specifically it is related to a white LED package structure and its packaging methods.

2. Background Art

As a semiconductor lighting device, LED has superior advantages over traditional lighting devices, such as incandescent bulb and fluorescent tube, with a longer life time, a more compact size, a lower applied voltage source, no mercury pollution, and a more energy saving property. Therefore it is called the first option of the green lighting sources, and has already been widely used in signal light, display, and LCD backlighting. There is also a trend for the LED to replace the incandescent and fluorescent in general illumination area.

In a traditional method for making a white LED, the phosphor containing layer is directly dispensed onto and cover the surfaces of a blue or UV LED die so that the excited light from the phosphor with various wavelengths mixed together or mixed together with the excitation light if the excitation light is blue to create a white light emission. In this method, the LED suffers a great light absorption loss when the emitted light from the phosphor propagates backwardly into the LED die or to the substrate area around the LED die because of close proximity between phosphor and the LED die. An improving method is to separate the phosphor containing layer from the LED die by using a transparent spacer, such as a silicone, to reduce the chance of the excited emission from the phosphor to hit back into the LED die or the substrate area around the die. This has been described in the U.S. Pat. No. 5,959,316 as the prior art shown in FIG. 3. In FIG. 3, an LED die (60) is attached onto a substrate (62, and the phosphor containing layer (66) is separated from the LED die (60) by using a transparent spacer (64); outside the phosphor containing layer (66) is a protective transparent layer (68). The LED die is electrically connected to the substrate (62) by using gold wires. In this structure, the emitted light from the phosphor layer in a back forwarding direction can still hit the LED die or the substrate area around the die without any obstacle, causing light absorption.

SUMMARY OF INVENTION

The present invention is to solve the above mentioned problem by providing a white LED package and its packaging method, which effectively prevents excited emission from phosphor from going back and hitting LED die and substrate area around LED die, hence enhances white lighting efficiency.

The technical solution is to use a low refractive index silicone (the second type of silicone encapsulant) to separate the phosphor containing layer from the first type of silicone encapsulant, which is used to cover the LED dies. As the refractive index of the phosphor containing layer is larger than that of the low refractive index silicone (the second type of silicone encapsulant), the light rays emitted by phosphor with an incident angle larger than the critical angle on the interface of the second type of silicone and the phosphor containing layer will be reflected and prevented from going backward to hit the LED die and the substrate area around the LED die, so that less absorption can be ensured and the overall white light output can be improved.

The multilayered encapsulation structure with top convex shape is formed by utilizing surface tension phenomenon that is enabled by the multi-ring structure with sharp edge of the leadframe package.

The effective reflective index of the phosphor containing layer is higher than that of the layer resides directly below the phosphor containing layer to reduce the amount light going backward to hit the LED die and the substrate area around the LED die. This thus reduces light absorption loss and improves light output.

DETAILED DESCRIPTION OF THE INVENTION

This invention is related to a light emitting diode (LED) device; more specifically it is related to a white LED package structure and its packaging methods.

The LED package of the invention has a multilayered encapsulation structure that is formed by utilizing surface tension method and leadframe structure providing surface tension phenomenon.

Figure 1:
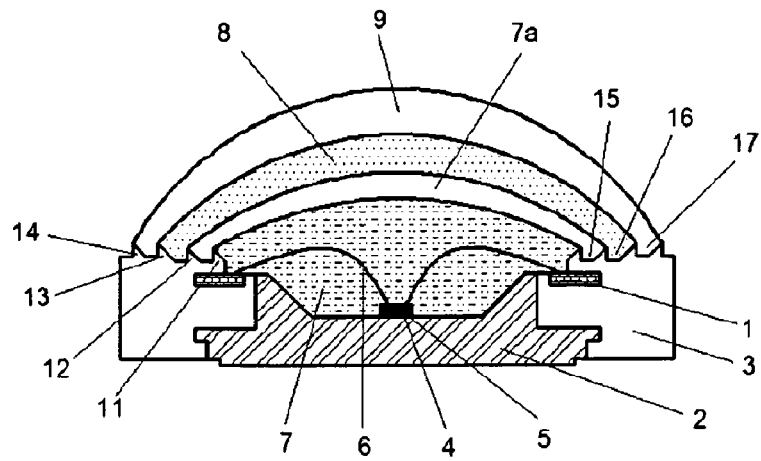
FIG. 1 is a schematic drawing of a cross-sectional view of a white LED package structure of the invention

The LED package of the invention as shown in FIG. 1 comprises of metal electrodes 1, a heat dissipation base 2, a PPA plastic 3 to fix the metal electrodes 1 and the heat dissipation base 2 together, an LED die 4, a die attach material 5, gold wires 6, silicone encapsulation layers 7 and 7a, a phosphor containing layer 8, an optical lens 9, sharp edge ring-alike structures 11, 12, 13, and 14 with a tilted inner surface, and ring-alike grooves 15, 16, and 17 formed between sharp edge ring-alike structures.

As shown in FIG. 1, the LED die 4 is attached onto the heat dissipation base 2 by using a die attach material 5, such as silver paste or solder, and electrically connected to the metal electrodes 1 by using gold wires 6. The metal electrodes 1, the heat dissipation base 2, and the PPA plastic 3 for fixing the electrodes 1 and the heat dissipation base 3 together can be bound together by using injection molding method. The first ring-alike object with a tilted inner surface 11 as a part of the PPA 3 is located around the reflective cup of the heat dissipation base 2, and forms an extended cup. The second ring-alike structure with a tilted inner surface 12 as a part of the PPA 3 is located around the first ring-alike structure with a tilted inner surface 11, and separated from each other by a gap that forms the first ring-alike groove 15. The third ring-alike structure 13 with a tilted inner surface as a part of the PPA 3 is located around the second ring-alike structure with a tilted inner surface 12, and separated from each other by a gap that forms the second ring-alike groove 16. The fourth ring-alike structure 14 with a tilted inner surface as a part of the PPA 3 is located around the third ring-alike structure with a tilted inner surface 13, and separated from each other by a gap that forms the third ring-alike groove 17.

The silicone encapsulation layer 7 completely covers the LED die and directly resides under the silicone encapsulation layer 7a, which directly resides under the phosphor containing layer 8. The phosphor containing layer 8 has a higher effective refractive index than the second type of silicone 7a in the visible wavelength range of light. The optical lens 9 resides on top of the phosphor containing layer 8.

The reflective index of the silicone material making the silicone encapsulation layer 7a is chosen so that it is lower than that of materials used to make the silicone encapsulation layer 7 and the effective refractive index of the phosphor containing layer 8.

The silicone encapsulation layer 7 is formed by dispensing liquid silicone material into the reflective cup of the heat dissipation base 2 and the above-mentioned extended cup. The top surface of the silicone encapsulation layer 7 can have a little convex shape that is formed by surface tension between silicone and the top sharp edge of the first ring-alike structure 11.

The second silicone encapsulation layer 7a can be achieved by dispensing liquid silicone material onto the silicone encapsulation layer 7 and be formed by the surface tension at the top sharp edge of the second ring-alike structure with a tilted inner surface 12.

The phosphor containing layer 8 can be achieved by dispensing a silicone uniformly mixed with phosphor onto the silicone encapsulation layer 7a and be formed by the surface tension at the top sharp edge of the third ring-alike structure with a tilted inner surface 13. The phosphor containing layer 8 has a conformal shape at the bottom surface and the top surface of a convex shape formed by surface tension phenomenon. The phosphor containing layer 8 can also be pre-made by uniformly mixing the phosphor into a material chosen from glass, PC, PMMA, and silicone; The phosphor containing layer 8 can also pre-made onto a concave surface of an optical lens 9.

There are several ways to make the LED package of the invention shown in FIG. 1.

The first method of making the multilayered encapsulation structure is as follows. (A) The first silicone for making the silicone encapsulation layer 7 is dispensed into the reflective cup composed by the surfaces of the metal electrodes 1, the heat dissipation base 2, and the PPA plastic 3, to cover the LED die 4; The dispensed silicone 7 spontaneously forms a convex lens surface by the surface tension at the top sharp edge of the first ring-alike structure with a tilted inner surface 11; The dispensed silicone 7 is solidified by using the method of heating or UV radiating. (B) A second silicone with the reflective index lower than that of the first silicone is dispensed onto the convex surface of the first silicone encapsulation layer 7 to form the second silicone encapsulation layer 7a. The dispensed silicone 7a spontaneously forms a convex lens surface by the surface tension at the top sharp edge of the second ring-alike structure with a tilted inner surface 12; The dispensed second silicone is solidified by using the method of heating or UV radiating. (C) A silicone uniformly mixed with phosphor is dispensed onto the convex surface of the silicone encapsulation layer 7a, and is formed into a lens shape featured with a conformal concave inner surface and a convex outer surface by the surface tension at the top sharp edge of the third ring-alike structure with a tilted inner surface 13. The dispensed phosphor-silicone layer 8 is solidified by using the method of heating or UV radiating. (D) Using a similar procedure, a clear silicone is then dispensed onto the convex surface of the phosphor containing layer 8 to form a convex and conformal concave optical lens 9 by utilizing the surface tension feature at the top sharp edge of the fourth ring-alike structure with a tilted inner surface 14. The dispensed silicone is then cured by using the method of heating or UV radiating.

The second method of making the multilayered encapsulation structure is as follows. (A) The first silicone for making the silicone encapsulation layer 7 is dispensed into the reflective cup composed by the surfaces of the metal electrodes 1, the heat dissipation base 2, and the PPA plastic 3, to cover the LED die 4; The dispensed silicone 7 spontaneously forms a convex lens surface by the surface tension at the top of the first ring-alike structure with a tilted inner surface 11; The dispensed silicone 7 is solidified by using the method of heating or UV radiating. (B) A proper amount of the second silicone 7a is dispensed into the concave area of the pre-made phosphor containing layer 8. (C) The phosphor containing layer 8 is reversed and put onto the convex surface of the silicone 7. The dispensed silicone is solidified by using the method of heating or UV radiating to seal the phosphor containing layer 8 onto the silicone encapsulation layer 7 and form the second encapsulation layer 7a. (C) Using a similar procedure, a clear silicone is then dispensed onto the convex surface of the phosphor containing layer 8 to form a convex and conformal concave optical lens 9 by utilizing the surface tension feature at the top sharp edge of the fourth ring-alike structure with a tilted inner surface 14. The dispensed silicone is then cured by using the method of heating or UV radiating.

The third method of making the multilayered encapsulation structure is similar to the second method except that the phosphor containing layer 8 and the optical lens 9 are pre-made units and are joined together before putting onto the silicone encapsulation layer 7.

The fourth method of making the multilayered encapsulation structure is similar to the first method except that the optical lens 9 is a pre-made unit and is putting onto the phosphor containing layer 8 by using the same steps for applying a pre-made unit onto the package as described in the second method.

Figure 2:
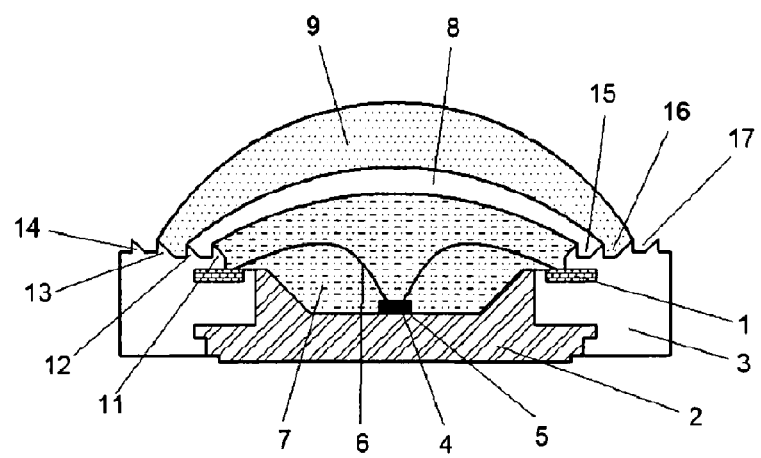
FIG. 2 is a schematic drawing of a cross-sectional view of an alternative white LED package structure of the invention
Figure 3:
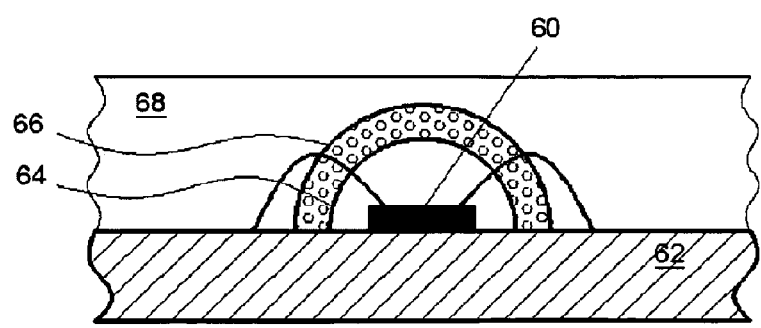
FIG. 3 is a schematic drawing of a cross-sectional view of a prior art

FIG. 2 shows an alternative structure of white LED package of invention. The LED package of the invention shown in FIG. 2 is similar to the LED package structure shown in FIG. 1 except that the silicone encapsulation layers 7 and 7a in FIG. 1 are combined into one layer of the same material in FIG. 2 and the effective reflective index of the phosphor containing layer 8 is higher than the reflective index of the silicone encapsulation layer 7.

The method of making the multilayered encapsulation structure as shown in FIG. 2 is as follows. (A) The silicone encapsulation layer 7 is dispensed into the reflective cup composed by the surfaces of the metal electrodes 1, the heat dissipation base 2, and the PPA plastic 3, to cover the LED die 4; The dispensed silicone 7 spontaneously forms a convex lens surface by the surface tension at the top sharp edge of the first ring-alike structure with a tilted inner surface 11; The dispensed silicone 7 is solidified by using the method of heating or UV radiating. (B) A silicone uniformly mixed with phosphor is dispensed onto the convex surface of the silicone encapsulation layer 7, and is formed into a lens shape featured with a conformal concave inner surface and a convex outer surface by the surface tension at the top of the second ring-alike structure with a tilted inner surface 12. The dispensed phosphor-silicone layer 8 is solidified by using the method of heating or UV radiating. (C) Using a similar procedure, a clear silicone is then dispensed onto the convex surface of the phosphor containing layer 8 to form a convex and conformal concave optical lens 9 by utilizing the surface tension feature at the top of the third ring-alike structure with a tilted inner surface 13. The dispensed silicone is then cured by using the method of heating or UV radiating.

What is claimed is:

1. A white LED package comprising:
   a heat dissipation base;
   a plurality of electrodes disposed around the heat dissipation base;

a supporter surrounding and fixing the heat dissipation base and the plurality of electrodes;

at least two ring shaped protrusion structures protruding upward formed around a top surface of the supporter;

at least one ring-shaped groove formed between the at least two ring-shaped structures;

at least one LED die mounted on a top surface of the heat dissipation base;

an encapsulation layer covering the LED die;

a phosphor containing layer covering the encapsulation layer; and an optical lens layer covering the phosphor containing layer, wherein the at least two ring-shaped protrusion structures comprise first, second and third ring-shaped protrusion structures, and an outer edge of the encapsulation layer extends to the first ring-shaped protrusion structure, an outer edge of the phosphor containing layer extends to the second ring-shaped protrusion structure and an outer edge of the optical lens layer extends to the third ring-shaped protrusion structure, wherein the first, second and third ring-shaped protrusion structures have sharp top edges and tilted inner surfaces, and wherein the encapsulation layer, the phosphor containing layer and the optical lens layer have convex outer surfaces formed by surface tension at the sharp top edges of the first, second and third ring-shaped protrusion structures, respectively.

2. The white LED package of claim 1, wherein the supporter is formed of a PPA (polyphthalamide) plastic.

3. The white LED package of claim 1, wherein an effective refractive index of the phosphor containing layer is higher than that of the encapsulation layer.

4. The white LED package of claim 1, wherein the encapsulation layer an the optical lens layer are formed from silicone resin.

5. The white LED package of claim 1, wherein the phosphor containing layer is formed by uniformly mixing phosphor material into glass, PC, PMMA or silicone resin.

* * * * *